United States Patent
Smith (10) Patent No.: US 6,876,204 B2
(45) Date of Patent: Apr. 5, 2005

(54) TEST INSTRUMENT FOR ARC FAULT CIRCUIT INTERRUPTERS

(75) Inventor: Jeffrey L. Smith, Carlsbad, CA (US)

(73) Assignee: IDEAL Industries, Inc., Sycamore, IL (US)

( * ) Notice: Subject to any disclaimer, the term of this patent is extended or adjusted under 35 U.S.C. 154(b) by 0 days.

(21) Appl. No.: 10/423,170

(22) Filed: Apr. 25, 2003

(65) Prior Publication Data

US 2004/0212372 A1 Oct. 28, 2004

(51) Int. Cl.[7] .................... H01H 9/50; G01R 31/333
(52) U.S. Cl. ........................... 324/536; 324/424
(58) Field of Search ........................ 324/536, 424, 324/423, 76.12, 527, 603, 604

(56) References Cited

U.S. PATENT DOCUMENTS

| | | | |
|---|---|---|---|
| 4,857,826 A | | 8/1989 | Graham |
| 5,459,630 A | | 10/1995 | MacKenzie et al. |
| 6,072,317 A | | 6/2000 | Mackenzie |
| 6,088,205 A | * | 7/2000 | Neiger et al. ............. 361/42 |
| 6,218,844 B1 | | 4/2001 | Wong et al. |
| 6,313,642 B1 | | 11/2001 | Brooks |
| 6,426,634 B1 | * | 7/2002 | Clunn et al. ............ 324/536 |
| 6,507,283 B1 | * | 1/2003 | Calvin ................... 340/644 |
| 6,583,997 B1 | * | 6/2003 | Reid et al. .............. 363/50 |
| 2003/0090271 A1 | * | 5/2003 | Hurwicz ................ 324/424 |

* cited by examiner

*Primary Examiner*—N. Le
*Assistant Examiner*—Jeff Natalini
(74) *Attorney, Agent, or Firm*—Cook, Alex, McFarron, Manzo, Cummings & Mehler, Ltd.

(57) ABSTRACT

An arc fault interrupter tester creates a simulated arc fault current through a full wave bridge rectifier, a load resistor and a switch connected in series. These components are rated at currents and wattage well below the current of the simulated arc fault. Thermal management in the form of a temperature sensor and control pulse timing and duration prevent damage to the low-rated components.

35 Claims, 10 Drawing Sheets

TEST INSTRUMENT FOR ARC FAULT CIRCUIT INTERRUPTERS

BACKGROUND OF THE INVENTION

This invention relates to electrical testing devices and is particularly concerned with a test instrument for checking the operability of arc fault circuit interrupters installed in electrical distribution circuits. One form of the invention can also perform tests for ground fault interrupters, load carrying capacity and proper wiring.

The common type of circuit breaker used for residential, commercial, and light industrial applications has an electro-mechanical thermal-magnetic trip device to protect against short circuit and overcurrent conditions. Some circuit breakers also include ground fault interrupters which trip in response to a line to ground fault. More recently, interest has arisen in protecting against arc faults as well. Arc faults are intermittent, high impedance faults, which can be caused by corroded, worn or aged wiring or insulation, loose connections, wiring damaged by nails or driven through the insulation and the like. Arc faults can occur in the permanent wiring, receptacles or in the wiring of loads or extension cords plugged into a receptacle. Arcing faults occur when electric current "arcs" or flows through ionized gas between two ends of a broken conductor, between two conductors supplying a load or between a conductor and ground. Because of their intermittent and high impedance nature, arc faults do not generate currents of sufficient instantaneous magnitude or sufficient average current to trigger standard circuit breakers. Nevertheless, arc faults present a fire hazard because they can generate sufficient heat to ignite insulation or adjacent combustible materials.

An arc fault circuit interrupter (AFCI) can sense the current passing through the line conductor of a branch circuit, process the sensed information to determine whether the characteristics of the line current represent the occurrence of an arc fault, and trip open the branch circuit in which an arcing fault has occurred. An example of such a device is shown in U.S. Pat. No. 5,682,101.

Upon installation of an AFCI, and periodically thereafter, the AFCI should be tested to verify that it is operating properly and will provide the intended protection. Some AFCI's provide a built-in test circuit. This approach has been criticized as testing only the trip mechanism of the AFCI and not its sensing circuitry. To overcome this situation plug-in testers have been developed which create a simulated arc fault condition remote from the AFCI. Examples of such devices are shown in U.S. Pat. Nos. 6,072,317, 6,218,844 and 6,313,642. While these devices provide the basic function of testing an AFCI, they have certain drawbacks which prevent them from fulfilling the need for a simple, effective, reliable and safe method and apparatus for testing an AFCI.

SUMMARY OF THE INVENTION

The present invention is a microprocessor-based AFCI tester. The tester, or a connecting cord therefor, plugs into a receptacle of a branch circuit whose AFCI is to be tested. The hot and neutral legs of the branch circuit are the inputs to a bridge rectifier, with the hot leg passing through a fuse. The outputs of the bridge rectifier are utilized as the positive and negative power source for the testing circuit, which testing circuit will be referred to as the test rails. A simulated arc fault current is generated under microprocessor control via a MOSFET transistor in series with a load resistor across the test rails. The arc fault test consists of between eight to twelve consecutive control pulses applied to the FET which in turn creates a simulated arc fault current placed on the test rails at or near the peak voltage seen on the test rails. The control pulse width is nominally 325 microseconds in width. The simulated arc fault current is current limited by the load resistor that is in series with the MOSFET transistor. The nominal total load resistance is 1 ohm. The firing sequence of the test control pulses is based off a zero crossing of the AC voltage that is detected by the microprocessor and occurs approximately every 8.33 milliseconds and is nominally 4.167 milliseconds after zero cross.

Given this timing of the control pulses and the resulting current pulses, it has been found that the current ratings for the bridge and the MOSFET transistor can be only a fraction of the current that is actually passed through these components. Similarly, the watt rating of the load resistor is only a fraction of the wattage dissipated by the resistors for a very short time. By preventing thermal runaway, far less expensive components can be used while still maintaining an adequate safety margin. Thermal runaway is prevented by the timing of the microprocessor, by a FET pre-driver that shuts off the FET if a maximum current limit is exceeded, and by a temperature sensor placed in contact with or near the load resistor. The operation of the arc fault load is inhibited if the load temperature crosses into the thermal region where the load has started to enter the thermal rise just prior to thermal runaway. Due to the nature of the utilization of the arc fault load being pulsed at a specific interval and duration, it is possible to limit the operation of the arc fault circuit such that the load is not allowed to overheat and in fact reaches a parity temperature that is self-sustaining. This is done while staying within the component manufacturer's rated temperature for the device.

BRIEF DESCRIPTION OF THE DRAWINGS

FIGS. 2a and 2b are collectively referred to as FIG. 2 hereafter.

FIGS. 11a and 11b are collectively referred to as FIG. 11 hereafter.

DETAILED DESCRIPTION OF THE INVENTION

Figure 1:
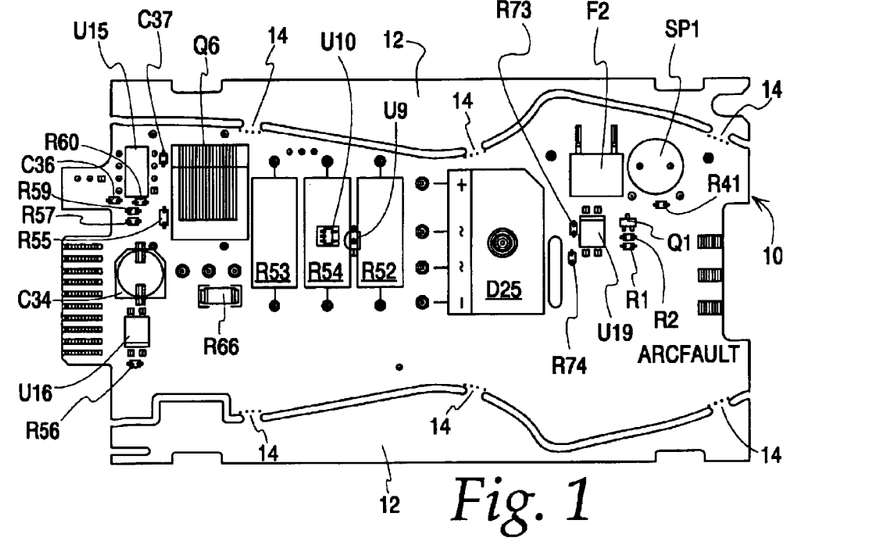
FIG. 1 is a printed circuit board assembly of a first embodiment of the tester of the present invention, looking at the far side of the board.
Figure 6:
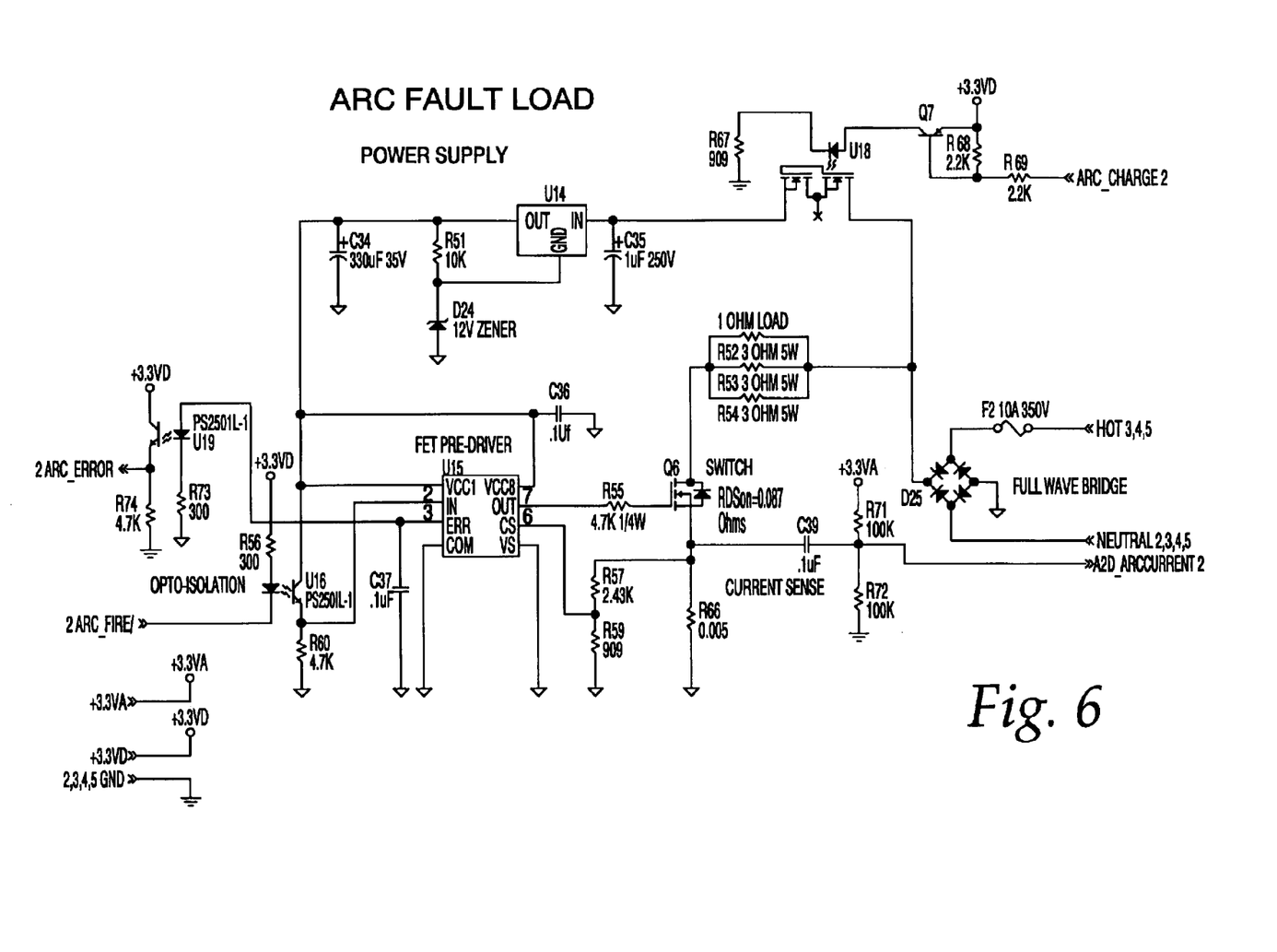
FIG. 6 is a circuit diagram showing the arc fault test portion according to the first embodiment.
Figures 7, 8:
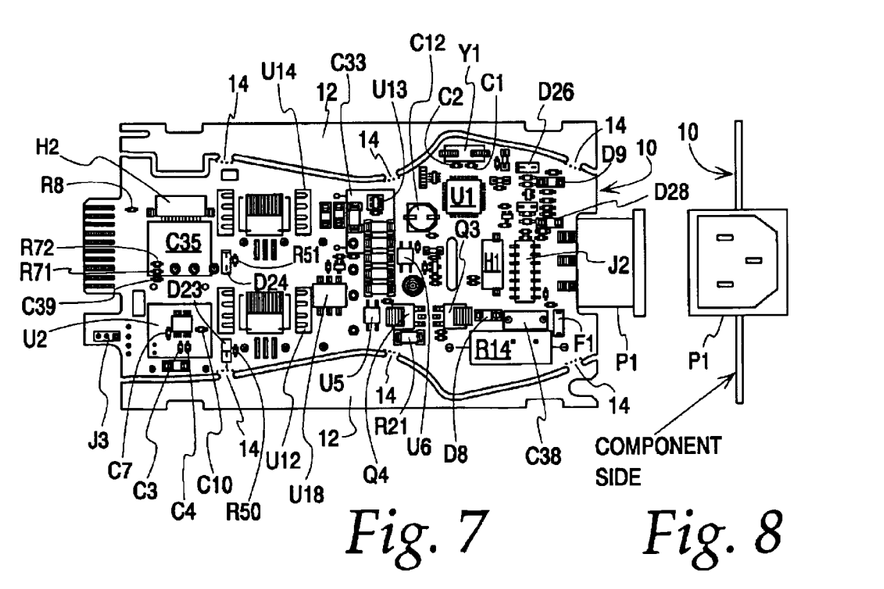
FIG. 7 is the printed circuit board assembly showing the component side of the board of FIG. 1.
FIG. 8 is an end view of the printed circuit board showing the power connector.

The printed circuit board for an arc fault tester unit according to the present invention is shown at 10 in FIGS. 1, 7 and 8. The board is illustrated with certain breakaway portions 12 still attached by tabs 14. These portions will be removed prior to installation of the circuit board in a suitable housing or case. As seen in FIGS. 7 and 8, the circuit board 10 includes a power connector P1 which is connectable to a branch circuit of an AC electrical system by means of a suitable cord (not shown). The various components of the circuit shown in FIGS. 2–6 are mounted as indicated in FIGS. 1, 7 and 8.

An important factor in the physical layout of the components is the proximity between one of the load resistors R54 and a temperature sensor U10, or an alternate temperature sensor U9. This arrangement is shown in FIG. 1. R54 is a 3 ohm 5 watt resistor with its leads connected to the circuit board. The temperature sensor U10 is underneath the resistor and in contact with it. As will be explained below, the temperature sensor U10 needs to be in close proximity with the load resistor. By close proximity it is meant either directly, physically contacting the resistor or close enough such that heat from the resistor is reliably transferred to the temperature sensor and the temperature sensor is able to pick up an accurate reading of the temperature of the resistor. An alternate construction would be to use a resistor in the form of a surface mounted device. In that case the sensor would be put as close as possible to the resistor with a copper pad underneath both for the purpose of transferring heat from the surface mount resistor to the temperature sensor. Thus, it will be understood that while direct physical contact between the load resistor and the temperature sensor is one way to accomplish the temperature sensing function, a slight separation between the two is possible and is within the scope of the present invention.

Turning now to the circuit diagram shown collectively in FIGS. 2–6, it will be understood that the circuit lines that connect between various ones of the figures have labels generally indicating the type of signal on that line as well as the connecting figure number. For example, in FIG. 2 underneath the microprocessor U1 there is a line terminating at double arrows labeled arc_fire/6. This indicates that this line carries the arc test firing signal and connects to the similarly labeled line of FIG. 6. Looking briefly at FIG. 6 it will be noted in the lower left corner there is a line labeled 2 arc_fire/. This indicates that this line connects to the arc_fire line of FIG. 2.

Figure 2A:
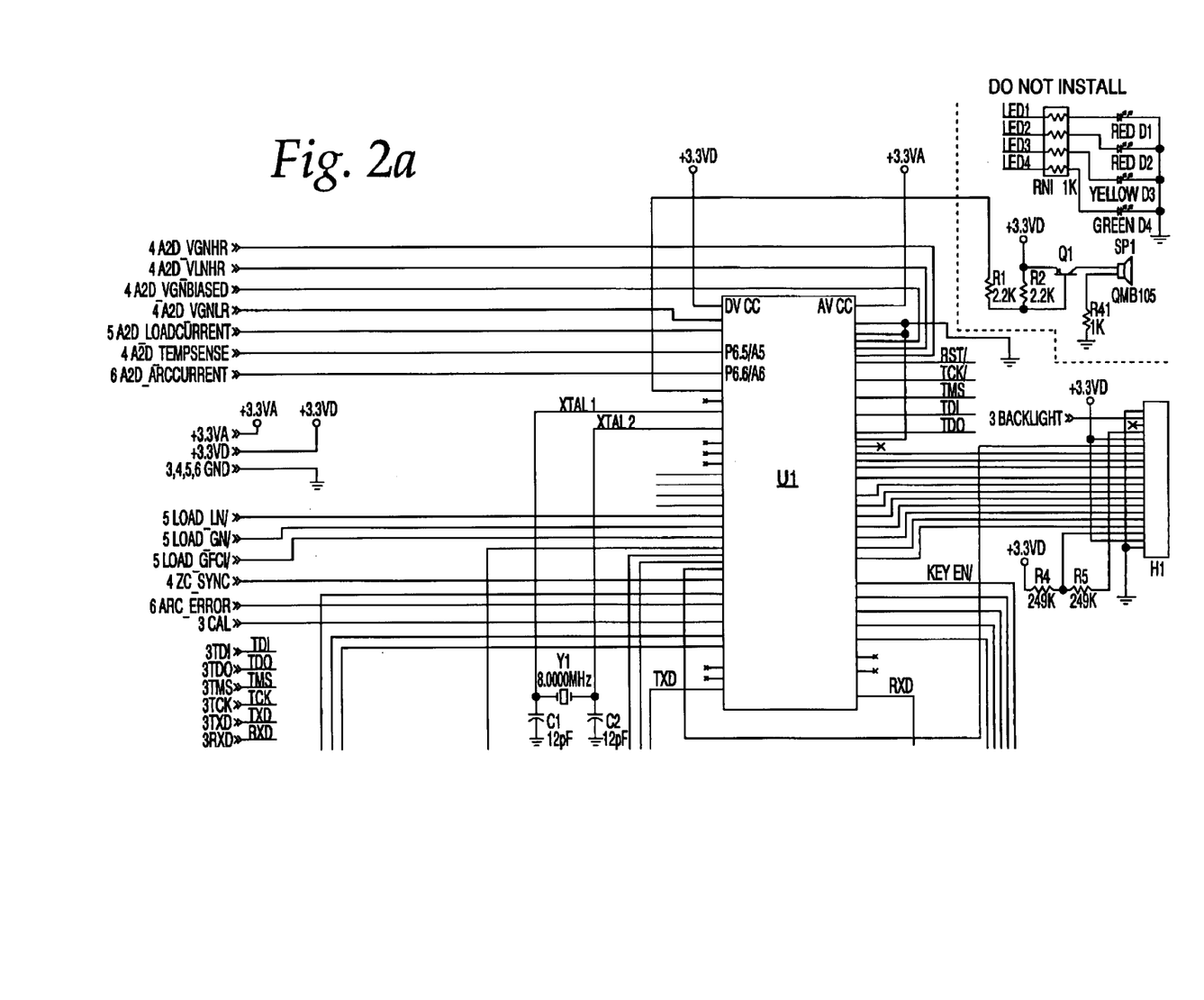
FIG. 2a is a circuit diagram of a portion of a first embodiment of the invention, showing a first part of the microprocessor section.
Figure 2B:
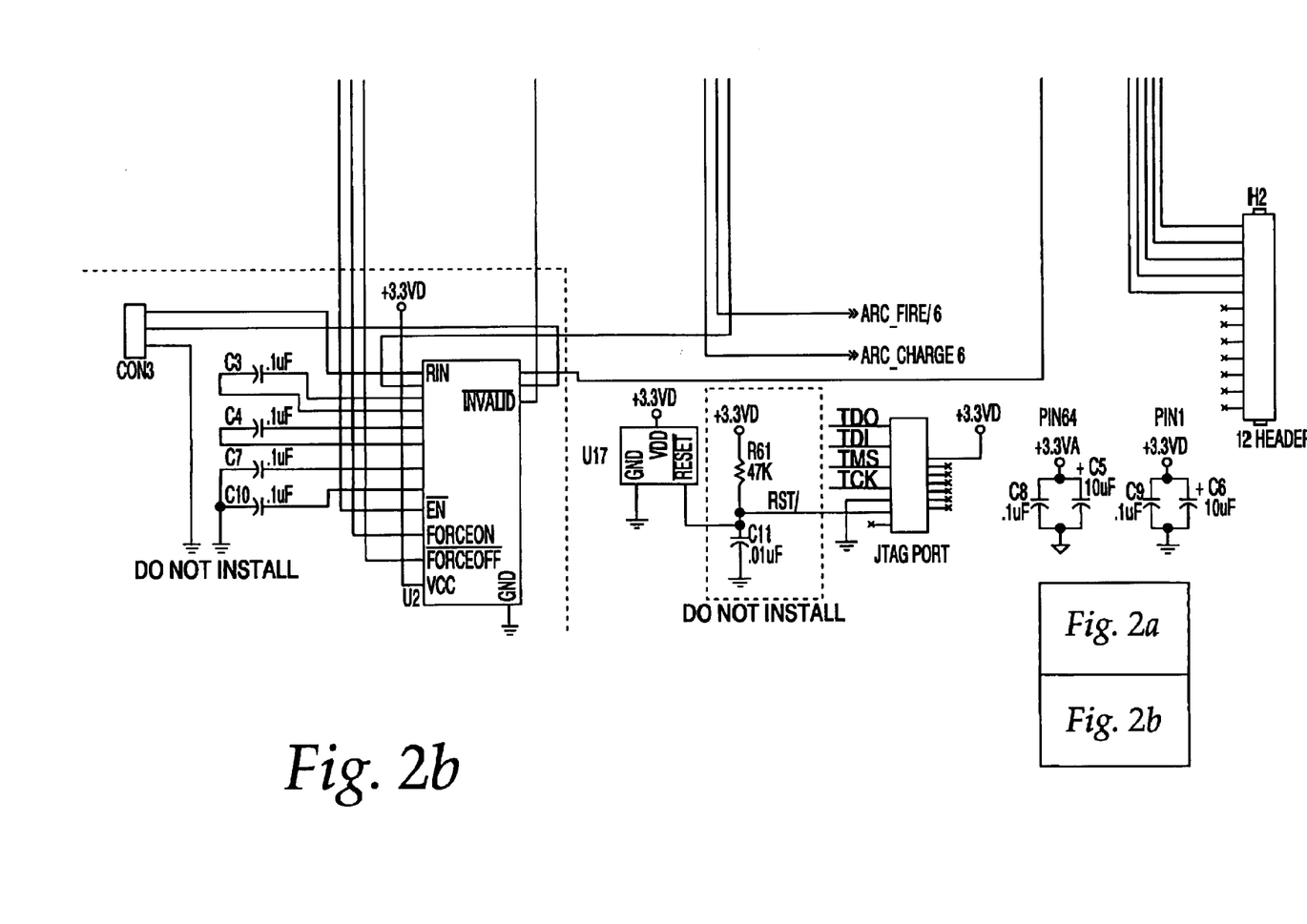
FIG. 2b is a second part of the circuit diagram shown in FIG. 2a and it includes a key which shows how to combine FIGS. 2a and 2b to illustrate the entire circuit diagram of the microprocessor section.

Looking at FIG. 2, the microprocessor U1 is connected to an LCD connector H1. This connector is itself attached by a flexible ribbon cable (not shown) to a suitable LCD display mounted in the housing. The microprocessor is also connected to a header H2. Similar to connector H1, the header H2 has a ribbon cable connecting it to a membrane keypad (not shown) on the housing. The keypad enables a user to choose between an arc fault test or a ground fault test or the user can step through other tests such as line voltage, voltage drop, ground and neutral voltage and line impedance. These tests are conveniently combined with the arc fault test section of the present invention. These tests can be performed by circuitry such as that shown in U.S. Pat. No 4,857,826, the disclosure of which is incorporated herein by reference. Several lines associated with these tests are shown in the upper left corner of FIG. 2. All of these are labeled beginning with A2D_ which indicates an analog to digital conversion. The V in those labels stands for voltage and then the next item either gn or ln indicates whether the connection is to ground or line. The HR stands for high range (above 5 volts) and the LR stands for low range (below 5 volts). It will also be noted that the temperature sensing signal comes into this section on line A2D_TempSense from the temperature sensor U10 (or alternately U9) as shown in FIG. 4.

Several portions of FIG. 2 are labeled "do not install." For example, the RS232 I/F section in the lower left corner is used for software development only and is not intended to be part of the final circuit tester. Similarly, the section in the upper right corner delineated by a dotted line is also used for software development and is not part of the final test unit. Finally, in the lower central portion there is a reset circuit U17. The alternate reset circuit delineated by the dotted box could be used if there were no arc fault test being installed with a particular testing device.

Figure 3:
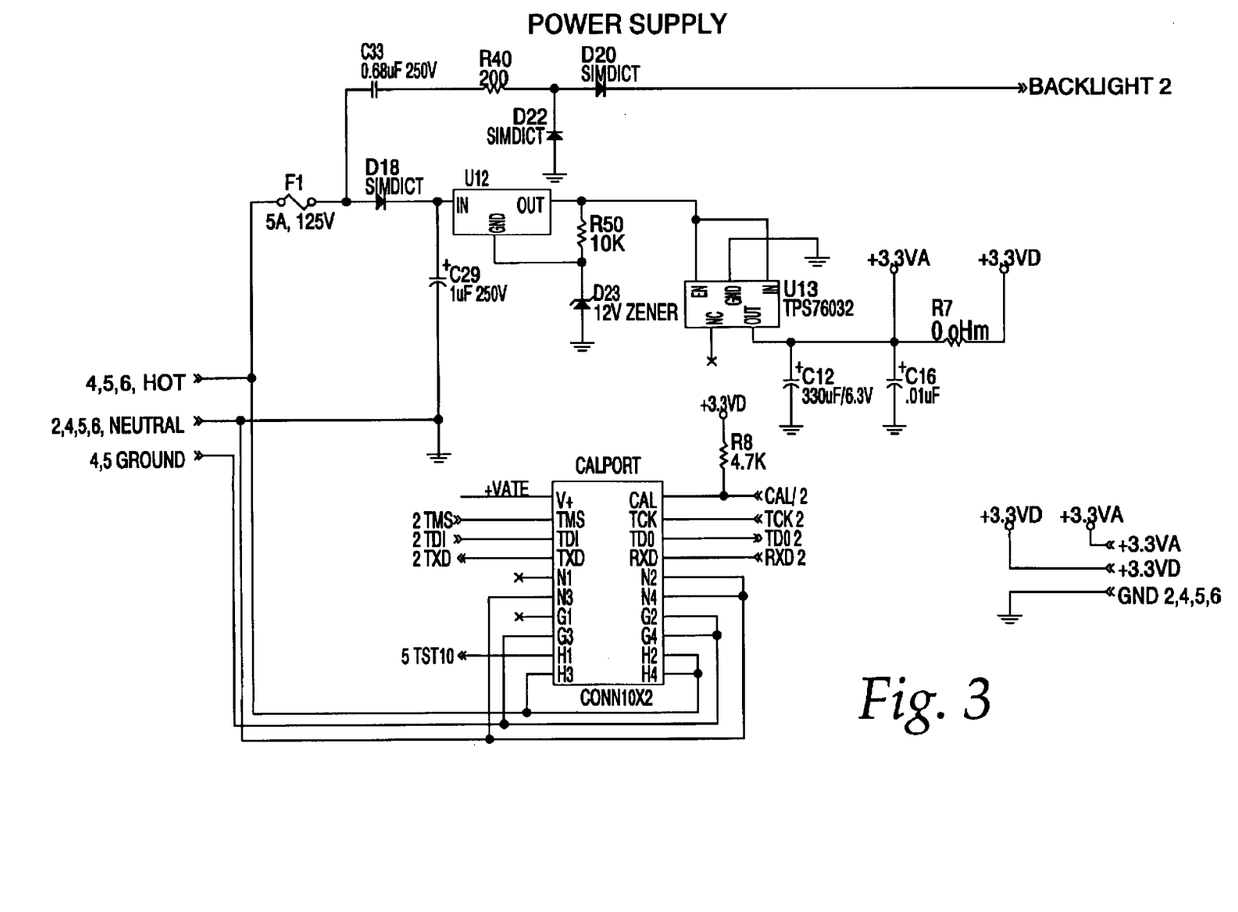
FIG. 3 is a circuit diagram showing the power supply portion of the tester circuit.

Looking briefly at FIG. 3, a conventional power supply is shown. This section receives the AC power on the hot, neutral and ground lines and converts it as needed to appropriate voltage for use throughout the rest of the circuit. This section is shown for completeness of the circuit, but otherwise forms no part of the present invention.

Figure 4:
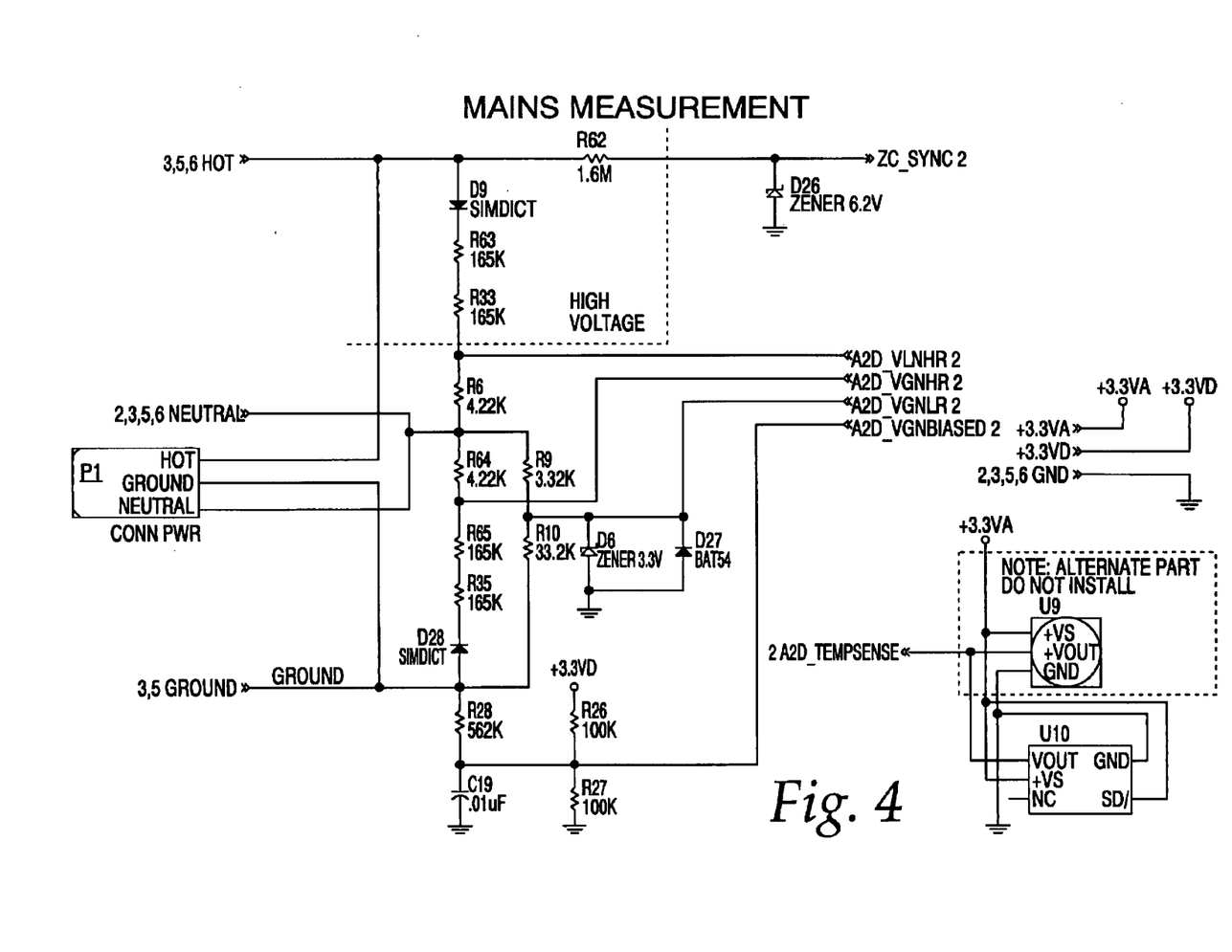
FIG. 4 is a circuit diagram showing the mains measurement portion and the temperature sensor portion of the tester circuit.

FIG. 4 shows the power connector P1 connecting the branch circuit to the mains measurement portion of the circuit. This section measures the potential between hot, neutral and ground, the RMS voltage, peak voltage and checks for proper wiring, all as described in the 4,857,826 patent. It will be noted that the resistor R62 and the zener diode D26 clip the voltage between hot and neutral and limit the current to a couple milliamps while producing a zero crossing signal on the line ZC_sync. This provides an indication to the microprocessor U1 as to when the AC power signal is crossing zero volts. Again, this is a standard implementation for zero crossing detection. The other item of note in FIG. 4 is the temperature sensor U10 which is physically mounted as described above in connection with FIG. 1. U9 is an alternate device that could be used in place of U10.

Figure 5:
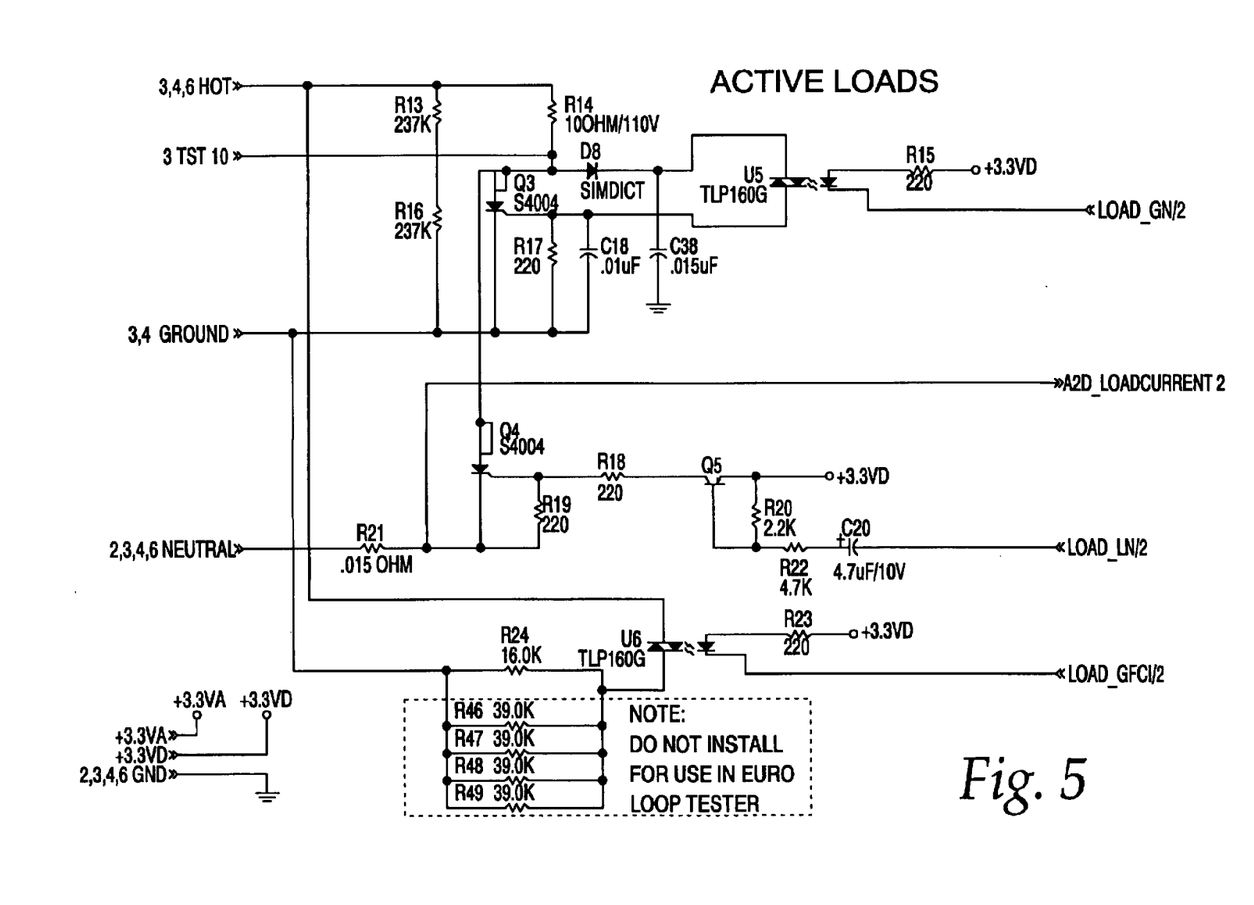
FIG. 5 is a circuit diagram showing the active loads portion of the circuit.

FIG. 5 is the active load test section of the circuit. It is used to check for correct wiring, as implemented in the 4,857,826 patent. This section may also perform a ground fault interrupter test.

Looking now at FIG. 6, the arc fault test section of the circuit is illustrated. The hot and neutral lines are connected to a full wave bridge rectifier D25. The diode bridge D25 is a relatively low rated device, something on the order of 10 amps or less has been found suitable. The hot connection is through a fuse F2. The positive output of the bridge is supplied to a 1 ohm load which in this embodiment comprises three resistors R52, R53 and R54 connected in parallel to one another. These are each 3 ohm 5 watt resistors which combine to form a 1 ohm load. The load is selected to allow a maximum current of 142 amps at 120 VAC and a minimum of 106 amps at 120 VAC.

The load resistors R52, R53 and R54 are connected in series with a switch in the form of a MOSFET transistor Q6. This will be referred to hereinafter as the FET. The FET is rated at no more than 90 amps and in fact FETs rated as low as 25 amps have been found to be suitable, with FETS of approximately 45 amps and less being typically utilized. The FET Q6 is connected to a current sense section which includes capacitor C39 and resistors R71 and R72. This produces a signal on the line labeled A2D_ArcCurrent which allows the microprocessor to monitor how much current is being drawn by the load resistors. If this value gets too high the microprocessor shuts down the arc fault test. This is an optional and auxiliary way to make sure the current through the load resistors and FET is not so large as to create a dangerous condition.

The current sense section also includes resistor R66 and the voltage divider R57, R59. The voltage divider provides an input to the FET pre-driver U15. The pre-driver U15 will disable its output pin 7 if the current through the FET is over a preset level, for example 142 amps. This provides additional protection against an overcurrent situation. If there is an overcurrent situation that shuts down the pre-driver, the pre-driver produces an error signal on pin 3 which activates an optoisolator U19. Optoisolator U19 creates a signal on the arc_error line. This provides an indication to the microprocessor that a shutdown of the pre-driver U15 has occurred due to the overcurrent condition sensed on pin 6. Another purpose of the FET pre-driver is to drive the gate voltage of the FET Q6 from 0 to 15 volts in a few nanoseconds. In other words, the FET pre-driver U15 allows the FET to turn on hard and fast to get maximum current during the pulsing of the arc fault test.

The FET pre-driver U15 is connected to an optoisolator U16. The optoisolator receives the arc fire signal from the microprocessor on the line labeled arc_fire. U16 is used to isolate the microprocessor from the arc fault circuitry of FIG. 6 despite these sections of the circuit not having a common ground reference. The arc fault load circuitry of FIG. 6 is inside the bridge rectifier D25 whose output is local to the circuit shown in FIG. 6. This ground is different from the ground outside the arc fault circuit. There can be up to an approximate 50 volt difference between these grounds.

The arc fault section of the circuit includes its own local power supply. The positive output from the bridge D25 is supplied to an AC switch U18. U18 allows the microprocessor to shut down the local power supply to the arc fault section of the circuit. This is a further safety feature. The arc_charge line (in the upper right corner of FIG. 6) has to be set by the microprocessor U1 to enable the turn-on of AC switch U18. The microprocessor turns on U18 a few milliseconds before the twelve pulses of the arc test are sent. Then the arc_charge is turned off a few milliseconds after the twelve pulses. The remainder of the power supply includes a voltage regulator U14, resistor R51 and zener diode D24 and capacitors C34 and C35.

The use, operation and function of the arc fault tester are as follows.

A user connects the tester to the receptacle of a branch circuit through a cord connected to the connector P1. When the user wishes to perform an AFCI test, he or she presses the AFCI test button on the unit's housing, signifying to the microprocessor U1 that an arc fault test should be performed. The microprocessor checks for correct wiring of the branch receptacle before starting the arc fault test. If the wiring configuration is correct, the arc fault test feature is enabled. The microprocessor sets the arc_charge line so that AC switch U18 turns on and enables the power supply section of FIG. 6. Then the microprocessor checks for zero crossing of the AC voltage on the ZC_sync line and waits about 4.167 milliseconds after zero cross to place a signal on the arc_fire line. In other words, the arc_fire signal is sent at 90 or 270 electrical degrees of the AC voltage, i.e., at or near the peaks of the voltage. This pulse lasts about 325 microseconds. The pulses are sent in every half cycle and thus are approximately 8.33 milliseconds apart. Thus, the microprocessor turns on the arc_fire signal and turns it off. The arc_fire signal activates optoisolator U16, which activation is sensed on pin 2 of the FET pre-driver U15. As explained above, the FET pre-driver output on pin 7 turns on the FET Q6 hard and fast to get maximum simulated arc fault current through the load resistors R52, R53 and R54. That current is sensed by the current sense section. If it exceeds a preset level the voltage divider R57, R59 will cause the FET pre-driver to shut down. If the pre-driver shuts down, an error signal is generated through optoisolator U19 on line arc_error. Separately, the microprocessor can monitor how much current is being drawn through Q6 through the A2D_ArcCurrent line on the output of capacitor C39.

At all times the temperature sensor U10 (FIG. 4) is monitoring the temperature of the load resistor R54 and sending a signal indicative of that temperature to the microprocessor through line A2D_TempSense. If that temperature crosses into the thermal region where thermal runaway is threatened, the microprocessor will shut down the arc fault test. Under normal circumstances no shutdown will be required because the interval and duration of the simulated arc fault current is such that the components will not overheat. In fact, the test can be repeatedly run while staying within the manufacturer's rated temperature for the components in the arc fault test section.

The load resistors will cause brief bursts of simulated arc fault current of about 142 amps at 120 volts. Since the resistors are typically rated at only 5 to 7 watts, this load if it persisted would destroy the resistors. But the load lasts only 325 microseconds for a maximum of twelve pulses which are 8.33 milliseconds apart. At this rate and interval the parts, even though they are relatively inexpensive, will not degrade or fall.

The 142 amp current spikes will simulate an arc fault condition and will cause a properly operating AFCI to trip. It will be noted that the FET pre-driver will shut down the circuit even if there is some malfunction that causes unexpectedly high current. Similarly, the temperature sensor U10 will shut down the circuit if the temperature of the load resistor gets too high, regardless of the reason for the abnormality.

An alternate embodiment of the invention is shown in FIGS. 9–12. This is a simplified form which performs only an arc fault test after verifying proper wiring or a ground fault test. Thus, the voltage tests of the previous embodiment are not included. This provides a simplified and therefore less expensive instrument. It includes a printed circuit board 16 having a power connector P1 (FIG. 11) which plugs directly into a receptacle of a branch circuit. Connector P1 connects the hot line of the branch circuit to a fuse F1 and a full wave bridge rectifier D1. This bridge is rated at 10 amps. The positive output of the rectifier is connected to a power supply which includes a voltage regulator U2. This voltage regulator regulates up to 400 volts. There is also a low voltage regulator U1 that produces a 3.2 volt output.

Figure 10:
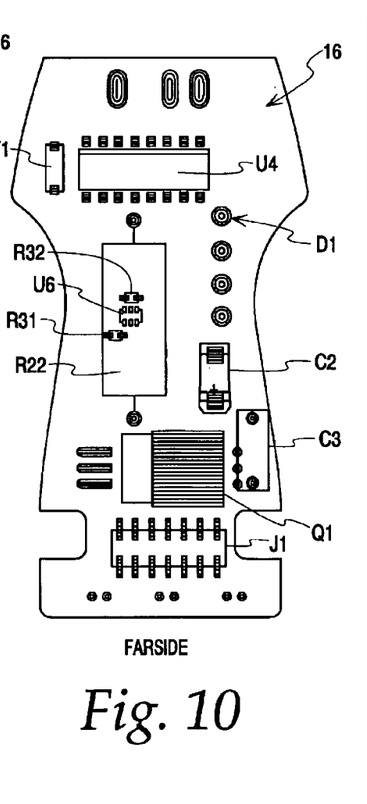
FIG. 10 is the printed circuit board assembly of the alternate embodiment showing the far side components.
Figure 11A:
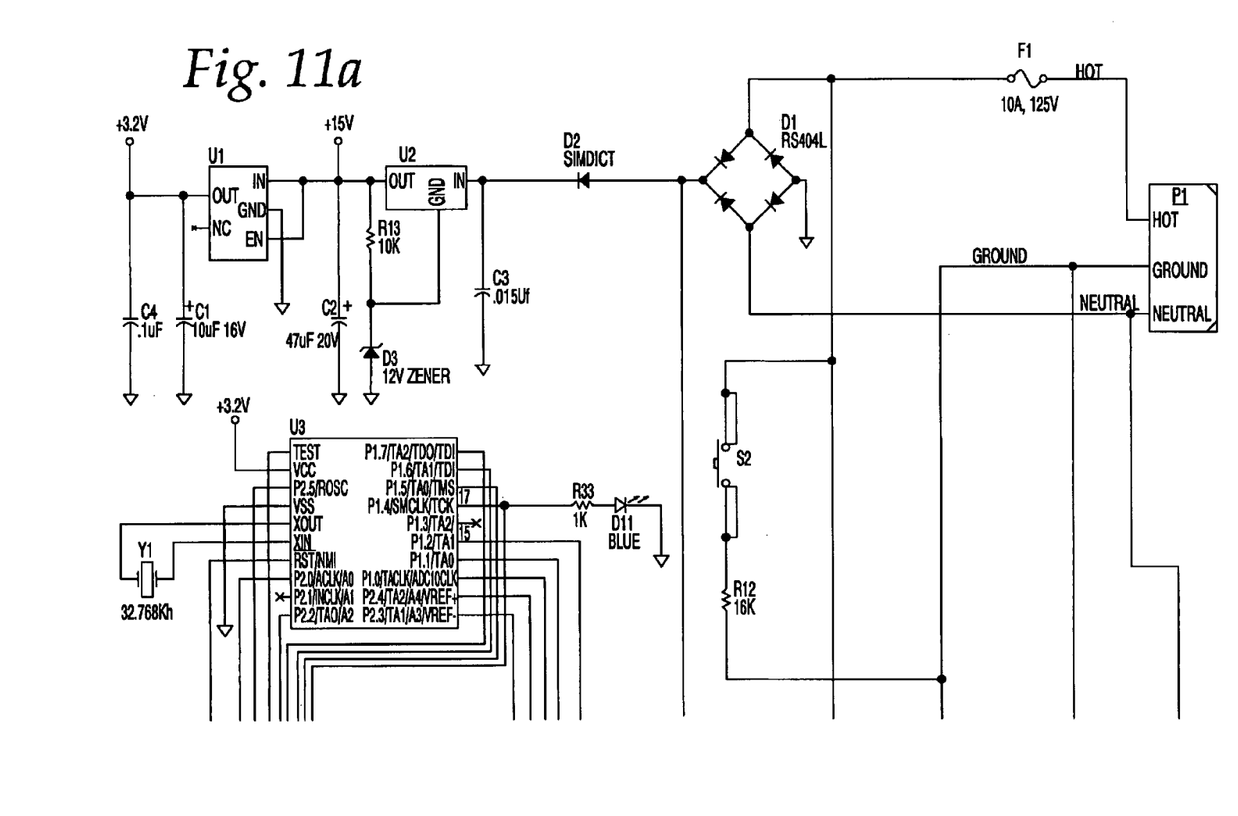
FIG. 11a is a circuit diagram of a first part of the alternate embodiment of FIGS. 9 and 10.
Figure 11B:
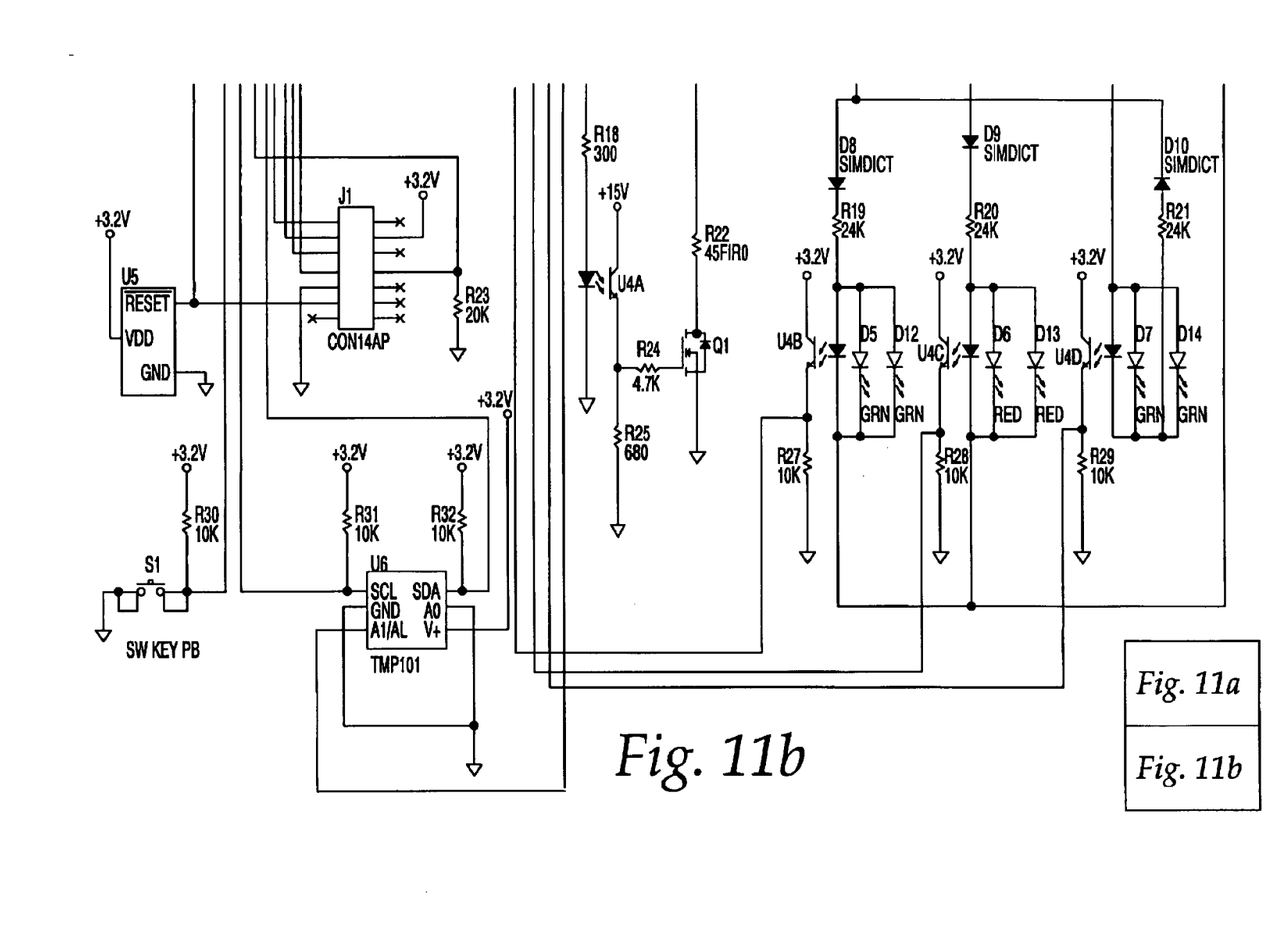
FIG. 11b is a second part of the circuit diagram shown in FIG. 11a and it includes a key which shows how to combine FIGS. 11a and 11b to illustrate the entire circuit diagram of the alternate embodiment of FIGS. 9 and 10.

The positive output of the bridge D1 also connects to a load resistor R22 which in turn connects to a MOSFET transistor Q1. The load resistor is a 1 ohm 5 watt resistor. The FET Q1 is rated at about 45 amps. Its gate is controlled by an optoisolator U4A. U4A is controlled by the output on pin 15 from the microprocessor U3. The microprocessor fires the optoisolator U4A to create pulses of the same width and frequency as for the circuit described above. Furthermore, the control pulses are sent at or near the peaks of the AC voltage, as in the previous embodiment. Thus, current spikes are drawn through R22 which will simulate an arc fault condition on the branch circuit. This arc fault test occurs when the user activates switch S1, as seen in the lower left of FIG. 11. A temperature sensor U6 is mounted in close proximity with the resistor R22. This is also illustrated in FIG. 10. As explained above, close proximity could mean either direct physical contact or such close spacing that the sensor U6 has an accurate representation of the temperature of the resistor R22.

The microprocessor has associated with it the usual auxiliary devices such as the crystal Y1, a reset U5 and a programming connector J1.

Figure 9:
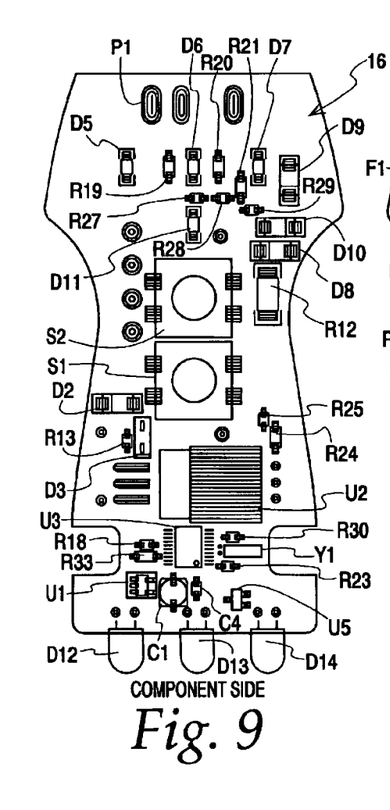
FIG. 9 illustrates the component side of a printed circuit board assembly of an alternate embodiment of the invention.
Figure 12:
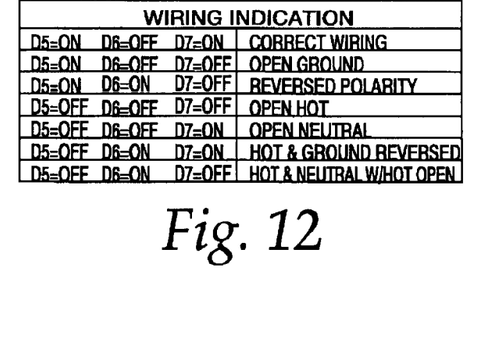
FIG. 12 is a chart indicating the wiring condition status for the circuit of FIG. 11.

A ground fault circuit interrupter test could be performed by activating the switch S2. This would create a ground fault current through resistor R12 from the hot to the ground lines outside the bridge. Wiring status is also indicated by LEDs D12, D13 and D14. These are mounted as shown in FIG. 9 and would be visible through windows in a suitable housing (not shown). These three LED's are connected in parallel with LED's D5, D6 and D7, respectively. The chart shown in FIG. 12 shows what the various combinations of LED signals indicate. For example, when D5 is on and D6 is off and D7 is on, the wiring of the branch circuit is correct.

The circuit also includes a blue LED D11. The microprocessor turns D11 on through pin 17 approximately one second prior to the commencement of an arc fault test. Then D11 is turned off. After the light goes out the microprocessor waits for a short delay, then starts the test. Then LED D11 is turned on simultaneously with creation of a control pulse. Thus, D11 will pulse twelve times during the test. Whenever the simulated arc is present, the LED D11 is on.

It should be pointed out that in both embodiments of the arc fault tester of the present invention, the current spikes which simulate an arcing condition are turned on at or around the peak of the AC line voltage. This is contrary to prior art testers which sought to avoid the peak voltage. The present invention deliberately seeks this turn-on point and controls the resulting current spike by shutting it down after 325 microseconds. The resulting 142 amp current spike is more than enough to trip a properly operating AFCI.

It is further pointed out that all of the components in the main arc fault test circuit, namely the bridge rectifier, the load resistor(s) and the FET, are rated much lower than they would need to be to carry a constant 142 amp load. This greatly reduces the cost of the device without sacrificing operability or safety. The key to this operational mode is the realization that the thermal heat generated by the energy being dissipated does not happen instantaneously. Due to the physical properties of the various materials utilized in the construction of the devices, each of which has a different thermal temperature coefficient, the time to thermal runaway and the destruction of the device is based on the materials, utilized, the mass of the materials, and the time the device is subjected to the overcurrent mode of operation. By keeping the duration of the overcurrent operation of the device less than the time that is required for thermal runaway, the physical rise in temperature of the device never exceeds the point at which the operation of the device is affected. In fact, the temperature remains below the manufacturer's rated temperature range.

While a preferred form of the invention has been shown and described, it will be realized that alterations and modifications may be made thereto without departing from the scope of the following claims. For example, as illustrated in the two embodiments, the load resistor can be either a single resistor or a combination of several resistors. Also, it has been found that the control pulse width could have a range from about 300 microseconds up to about 550 microseconds.

I claim:

1. A tester for an arc fault circuit interrupter in a branch circuit of an AC electrical system, the branch circuit having hot, neutral and ground lines, the tester comprising:

a full wave bridge rectifier having inputs connected to the hot and neutral lines of the branch circuit and having positive and negative outputs;

a load resistor and a switch connected in series between the positive and negative outputs of the rectifier; and a controller for generating control pulses during between eight and twelve consecutive half cycles of the AC signal, the control pulses occurring at a selected number of electrical degrees in the AC signal and for a selected duration, the controller being connected to the switch such that the control pulses turn said switch on to generate a simulated arc fault current in the branch circuit, the load resistor having a value which will cause the simulated arc fault current to be high enough to trip a properly functioning arc fault circuit interrupter;

the full wave bridge rectifier having a rating of between 5% to 20% of the simulated arc fault current, the switch having a rating of between 15% to 65% of the simulated arc fault current, and the load resistor having a watt rating which is less than about 15 watts.

2. The tester of claim 1 wherein the full wave bridge rectifier has a rating of about 7% of the simulated arc fault current.

3. The tester of claim 1 wherein the switch has a rating of about 31% of the simulated arc fault current.

4. The tester of claim 1 wherein the load resistor has a watt rating of about 5 watts.

5. The tester of claim 1 wherein the load resistor is a single resistor.

6. The tester of claim 1 wherein the load resistor is a plurality of individual resistors connected in parallel to one another.

7. The tester of claim 1 wherein the control pulses occur at about 90 and 270 electrical degrees in the AC signal.

8. The tester of claim 7 wherein duration of a control pulse is about 325 microseconds.

9. The tester of claim 1 wherein duration of a control pulse is about 325 microseconds.

10. A tester for an arc fault circuit interrupter in a branch circuit of an AC electrical system, the branch circuit having hot, neutral and ground lines, the tester comprising:

a full wave bridge rectifier having inputs connected to the hot and neutral lines of the branch circuit and having positive and negative outputs;

a single load resistor rated at about 5 to about 7 watts and a switch connected in series between the positive and negative outputs of the rectifier; and a controller for generating control pulses during between eight and twelve consecutive half cycles of the AC signal, the control pulses occurring at a selected number of electrical degrees in the AC signal and for a selected duration, the controller being connected to the switch such that the control pulses turn said switch on to generate a simulated arc fault current in the branch circuit, the load resistor having a value which will cause the simulated arc fault current to be high enough to trip a properly functioning arc fault circuit interrupter.

11. A tester for an arc fault circuit interrupter in a branch circuit of an AC electrical system, the branch circuit having hot, neutral and ground lines, the tester comprising:
a full wave bridge rectifier having inputs connected to the hot and neutral lines of the branch circuit and having positive and negative outputs;
a load resistor and a switch connected in series between the positive and negative outputs of the rectifier;
a controller for generating control pulses during between eight and twelve consecutive half cycles of the AC signal, the control pulses occurring at a selected number of electrical degrees in the AC signal and for a selected duration, the controller being connected to the switch,
a pre-driver connected in series between the controller and the switch such that upon receiving the control pulses the pre-driver turns said switch on to generate a simulated arc fault current in the branch circuit, the load resistor having a value which will cause the simulated arc fault current to be high enough to trip a properly functioning arc fault circuit interrupter.

12. The tester of claim 11 further comprising a current sense circuit connected in series with the switch and load resistor for sensing the current through the load resistor, the pre-driver being connected to receive a signal from the current sense circuit such that the pre-driver will shut down if the current through the switch and load resistor is greater than a predetermined limit.

13. The tester of claim 12 further comprising an error circuit connected between the pre-driver and the controller to report a shut down of the pre-driver to the controller.

14. The tester of claim 12 wherein the controller is connected to the current sense circuit and will cease generating control pulses in response to the signal from the current sense circuit exceeding a predetermined limit.

15. A tester for an arc fault circuit interrupter in a branch circuit of an AC electrical system, the branch circuit having hot, neutral and ground lines, the tester comprising:
a full wave bridge rectifier having inputs connected to the hot and neutral lines of the branch circuit and having positive and negative outputs;
a load resistor and a switch connected in series between the positive and negative outputs of the rectifier;
a controller for generating control pulses during between eight and twelve consecutive half cycles of the AC signal, the control pulses occurring at a selected number of electrical degrees in the AC signal and for a selected duration, the controller being connected to the switch such that the control pulses turn said switch on to generate a simulated arc fault current in the branch circuit, the load resistor having a value which will cause the simulated arc fault current to be high enough to trip a properly functioning arc fault circuit interrupter; and
a power supply connected to the positive and negative outputs of the bridge rectifier; and
an optoisolator connected between the controller and the switch, the optoisolator being activated by a control pulse from the controller to apply a voltage from the power supply to the switch.

16. The tester of claim 15 further comprising a pre-driver connected between the optoisolator and the switch, the pre-driver being further connected to the power supply.

17. The tester of claim 16 further comprising a current sense circuit connected in series with the switch and load resistor for sensing the current through the load resistor, the pre-driver being connected to receive a signal from the current sense circuit such that the pre-driver will shut down if the current through the switch and load resistor is greater than a predetermined limit.

18. The tester of claim 17 further comprising an error circuit connected between the pre-driver and the controller to report a shut down of the pre-driver to the controller.

19. The tester of claim 17 wherein the controller is connected to the current sense circuit and will cease generating control pulses in response to the signal from the current sense circuit exceeding a predetermined limit.

20. The tester of claim 15 further comprising an AC switch connected between the positive output of the bridge rectifier and the power supply, the AC switch being controlled by the controller to active said power supply only during an arc fault test.

21. A tester for an arc fault circuit interrupter in a branch circuit of an AC electrical system, the branch circuit having hot, neutral and ground lines, the tester comprising:
a full wave bridge rectifier having inputs connected to the hot and neutral lines of the branch circuit and having positive and negative outputs;
a load resistor and a switch connected in series between the positive and negative outputs of the rectifier;
a controller for generating control pulses during between eight and twelve consecutive half cycles of the AC signal, the control pulses occurring at a selected number of electrical degrees in the AC signal and for a selected duration, the controller being connected to the switch such that the control pulses turn said switch on to generate a simulated arc fault current in the branch circuit, the load resistor having a value which will cause the simulated arc fault current to be high enough to trip a properly functioning arc fault circuit interrupter; and
a temperature sensor mounted in close proximity to the load resistor and connected to the controller such that the controller will receive a resistor temperature signal from the temperature sensor and will stop generating control pulses if the temperature of the load resistor exceeds a predetermined limit.

22. The tester of claim 21 wherein the temperature sensor is mounted in direct physical contact with the load resistor.

23. The tester of claim 21 wherein the full wave bridge rectifier has a rating of about 7% of the simulated arc fault current.

24. The tester of claim 21 wherein the switch has a rating of about 31% of the simulated arc fault current.

25. The tester of claim 21 wherein the load resistor has a watt rating of about 5 watts.

26. The tester of claim 21 wherein the load resistor is a single resistor.

27. The tester of claim 21 wherein the load resistor is a plurality of individual resistors connected in parallel to one another.

28. The tester of claim 21 wherein the control pulses occur at about 90 and 270 electrical degrees in the AC signal.

29. The tester of claim 28 wherein duration of a control pulse is about 325 microseconds.

30. The tester of claim 21 wherein duration of a control pulse is about 325 microseconds.

31. A method of monitoring the operation of a tester for an arc fault circuit interrupter in a branch circuit of an AC electrical system, the branch circuit having hot, neutral and ground lines, the tester having a full wave bridge rectifier having inputs connected to the hot and neutral lines of the branch circuit and further having positive and negative outputs, a load resistor and a switch connected in series between the positive and negative outputs of the rectifier, and a controller for generating control pulses during between eight and twelve consecutive half cycles of the AC signal, the control pulses occurring at a selected number of electrical degrees in the AC signal and for a selected duration, the controller being connected to the switch such that the control pulses turn said switch on to generate a simulated arc fault current in the branch circuit, the load resistor having a value which will cause the simulated arc fault current to be high enough to trip a properly functioning arc fault circuit interrupter; said method of monitoring including the steps of sensing the temperature of the load resistor and suppressing the generation of control pulses if the sensed temperature exceeds a predetermined limit.

32. The method of claim 31 further comprising the steps of sensing the current through the switch and load resistor, and suppressing the generation of control pulses if the sensed current exceeds a predetermined limit.

33. The method of claim 31 further comprising the steps of placing a pre-driver between the controller and the switch, sensing the current through the switch and load resistor, and suppressing the transmission of control pulses through the pre-driver if the sensed current exceeds a predetermined limit.

34. The method of claim 31 further comprising the step of generating a visible pulse of light with each control pulse.

35. A tester for an arc fault circuit interrupter in a branch circuit of an AC electrical system, the branch circuit having hot, neutral and ground lines, the tester comprising:

a full wave bridge rectifier having inputs connected to the hot and neutral lines of the branch circuit and having positive and negative outputs;

a load resistor and a switch connected in series between the positive and negative outputs of the rectifier;

a controller for generating control pulses during between eight and twelve consecutive half cycles of the AC signal, the control pulses occurring at a selected number of electrical degrees in the AC signal and for a selected duration, the controller being connected to the switch such that the control pulses turn said switch on to generate a simulated arc fault current in the branch circuit, the load resistor having a value which will cause the simulated arc fault current to be high enough to trip a properly functioning arc fault circuit interrupter; and a light emitting diode connected to the controller, the controller activating the light emitting diode upon generation of each control pulse.

* * * * *